US012323055B2

United States Patent
Cheng et al.

(10) Patent No.: US 12,323,055 B2
(45) Date of Patent: Jun. 3, 2025

(54) DRIVER CIRCUITRY AND OPERATION

(71) Applicant: Cirrus Logic International Semiconductor Ltd., Edinburgh (GB)

(72) Inventors: Yongjie Cheng, Austin, TX (US); Lingli Zhang, Austin, TX (US); John L. Melanson, Austin, TX (US); Thomas H. Hoff, Austin, TX (US); Eric J. King, Austin, TX (US); Zhaohui He, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 429 days.

(21) Appl. No.: 17/678,527

(22) Filed: Feb. 23, 2022

(65) Prior Publication Data

US 2022/0376618 A1 Nov. 24, 2022

Related U.S. Application Data

(60) Provisional application No. 63/278,606, filed on Nov. 12, 2021, provisional application No. 63/220,469,
(Continued)

(51) Int. Cl.
*H02M 3/07* (2006.01)
*H02M 1/00* (2006.01)
(Continued)

(52) U.S. Cl.
CPC ............ *H02M 3/07* (2013.01); *H02M 1/0095* (2021.05); *H03F 3/2173* (2013.01); *H04R 3/00* (2013.01); *H03F 2200/03* (2013.01)

(58) Field of Classification Search
None
See application file for complete search history.

(56) References Cited

U.S. PATENT DOCUMENTS 7,808,324 B1 10/2010 Woodford et al.
11,190,096 B2 * 11/2021 Larsen ................ H04R 25/602
(Continued)

OTHER PUBLICATIONS

International Search Report and Written Opinion of the International Searching Authority, International Application No. PCT/GB2022/051242, mailed Aug. 12, 2022.
(Continued)

*Primary Examiner* — Paul W Huber
(74) *Attorney, Agent, or Firm* — Jackson Walker L.L.P.

(57) ABSTRACT

This application relates to methods and apparatus for driving a transducer. A transducer driver has a switch network that is operable to selectively connect a driver output to any of a first set of at least three different switching voltages which are, in use, maintained throughout a switching cycle of the driver apparatus. The switch network is also operable to selectively connect the driver output to flying capacitor driver. A controller is configured to control the switch network and flying capacitor driver to generate a drive signal at the driver output based on an input signal, wherein in one mode of operation the driver output is switched between two of the first set of switching voltages with a controlled duty cycle and in another mode of operation the driver output is connected to the flying capacitor driver which is switched between first and second states with a controlled duty cycle.

20 Claims, 7 Drawing Sheets

Related U.S. Application Data filed on Jul. 10, 2021, provisional application No. 63/190,582, filed on May 19, 2021.

(51) Int. Cl.
*H03F 3/217* (2006.01)
*H04R 3/00* (2006.01)

(56) References Cited

U.S. PATENT DOCUMENTS

| | | |
|---|---|---|
| 2008/0048618 A1 | 2/2008 | Melanson |
| 2011/0204962 A1 | 8/2011 | Gorisse et al. |
| 2015/0070090 A1 | 3/2015 | Somayajula et al. |
| 2020/0304111 A1 | 9/2020 | Ramadass et al. |
| 2020/0381996 A1 | 12/2020 | Khlat |
| 2021/0050832 A1* | 2/2021 | Lawrence ............ H03F 1/0238 |
| 2021/0399201 A1 | 12/2021 | Lesso |
| 2022/0376618 A1 | 11/2022 | Cheng et al. |

OTHER PUBLICATIONS

Combined Search and Examination Report under Sections 17 and 18(3), UKIPO, Application No. GB2400274.3, dated Dec. 2, 2024.

* cited by examiner

DRIVER CIRCUITRY AND OPERATION

FIELD OF DISCLOSURE

The field of representative embodiments of this disclosure relates to methods, apparatus and/or implementations concerning or relating to driver circuits, and in particular to switching driver circuits as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuitry may include a switching amplifier stage, e.g. a class-D amplifier output stage or the like, for generating the drive signal. Switching amplifier stages can be relatively power efficient and thus can be advantageously used in some applications. A switching amplifier stage generally operates to switch an output node between defined high-side and low-side switching voltages, with a duty cycle that provides a desired average output voltage over the course of the duty cycle for the drive signal.

At least one of the high-side and low-side voltages for the output driver may be generated from a suitable input voltage, e.g. a battery voltage, by a DC-DC converter. In some cases, the DC-DC converter may be a variable voltage converter operable to selectively vary the switching voltage in use.

FIG. 1 illustrates generally the principles of one example of a switching driver circuit 100 for driving a load transducer 101, where a switching voltage may be selectively varied. The driver circuit 100 comprises a class-D switching output stage 102, which could be implemented as a single-ended driver with a half-bridge switching stage or as a differential driver with a full bridge switching stage, as would be understood by one skilled in the art. The class-D switching output stage 102 is thus configured to switch an output node on at least one side of the load between high-side and low-side switching voltages VH and VL, with a duty cycle based on an input signal (not shown).

In the driver circuit of FIG. 1, the high-side switching voltage VH is generated from an input voltage, e.g. a battery voltage VBatt, by a DC-DC converter, which in this example comprises a charge pump 103. The charge pump 103 comprises a switch network and, in this example, two flying capacitors CF1 and CF2 and at least one reservoir capacitor CR. In this example, the charge pump 103 is operable to provide a variable boost level and is operable in different modes to provide an output voltage VCP with a magnitude which can be selected to be substantially equal to the input voltage, to twice the input voltage or to three times the input voltage.

In the example of FIG. 1, the variable voltage charge pump 103 is used to provide the high-side switching voltage VH, whilst the low-side voltage VL is a defined voltage, in this case ground.

Using a variable voltage charge pump to provide a selectively variable high-side switching voltage allows a high voltage to be used when required to provide a relatively high voltage drive signal. For example, with a differential output stage 102, an output drive voltage of a magnitude up to near 3×VBatt may be generated by operating the charge pump 103 in the three times mode and driving one output node of the class-D output stage with a duty cycle (in terms of proportion of time spent connected to the high-side switch voltage compared to the low-side switching voltage) at or near 100% and the other output node with a duty cycle at or near 0%. However, for lower signal levels, e.g. with a magnitude below 2×VBatt or below VBatt, the charge pump 103 may be operated in the two times mode or one times mode respectively. Varying the output voltage of the charge pump 103 in this way can improve power efficiency.

Whilst a driver circuit such as illustrated in FIG. 1 can be satisfactorily used in a number of applications, in general there is a desire for driver circuitry that may offer improvements with regard to the trade-off between circuit area and system efficiency, whilst meeting power output and performance requirements such as total harmonic distortion.

SUMMARY

Embodiments of the present disclosure relate to improved switching driver circuits and to methods of operation.

According to an aspect of the disclosure there is provided a driver apparatus for driving a transducer based on an input signal comprising:
  a first driver output node for outputting a first drive signal;
  a switch network;
  a flying capacitor driver having an output voltage node for connection, in use, to a first terminal of a flying capacitor, the flying capacitor driver being selectively operable in a first state with a second terminal of the flying capacitor connected to a first input voltage and the first terminal of the flying capacitor connected to a second input voltage to charge the flying capacitor and driver the output voltage node to the second input voltage and a second state with a second terminal of the flying capacitor connected to a third input voltage, different to the first voltage, and first terminal of the flying capacitor disconnected from the second input voltage to drive the output voltage node to a boosted voltage; and
  a controller;
  wherein the switch network is operable to selectively connect the first driver output node to the output voltage node of the flying capacitor driver or to any of a first set of at least three different switching voltages, wherein the switching voltages of the first set are, in use, maintained at a respective voltage node throughout a switching cycle of the driver apparatus; and
  wherein the controller is configured to control the switch network and flying capacitor driver to generate the first drive signal at the first driver output node based on the input signal, wherein in at least one mode of operation the first driver output node is switched between two of the first set of switching voltages with a controlled duty cycle based on the input signal and in at least one mode of operation the first driver output node is connected to the output voltage node of the flying capacitor driver and the flying capacitor is switched between the first and second states with a controlled duty cycle based on the input signal.

In some examples, the first set of switching voltages may comprise first and second supply voltages received by the driver apparatus. In some examples, the driver apparatus comprises a DC-DC converter configured to generate at least a third supply voltage from at least one of the first and second supply voltages. The DC-DC converter may comprise a charge-pump or inductive boost converter. In some examples, the first supply voltage may be less positive or more negative than the second supply voltage and the DC-DC converter may be configured to generate the third supply voltage as V3=V2+(V2−V1), where V1 is the first supply voltage and V2 is the second supply voltage.

In some examples, at least one of the first, second and third input voltages may be the same as a voltage of the first set of switching voltages. In some examples, the first set of switching voltages may comprise first and second supply voltages received by the driver apparatus and the first input voltage may be the same as the second supply voltage and each of the second and third input voltages may be the same the first supply voltage.

The driver apparatus may further comprise a second driver output node. The switch network may be further configured to selectively connect the second driver output node to the output voltage node of the flying capacitor driver or to any of the first set of at least three different switching voltages. The controller may be further configured to control the switch network and flying capacitor driver to generate a first drive signal at the second driver output node based on the input signal so as to drive a transducer connected between the first and second driver output nodes with a differential drive signal. The switch network may comprise: switches for selectively connecting the first and second output nodes respectively to a first voltage rail and switches for selectively connecting the first and second driver output nodes respectively to a second voltage rail; and switches for selectively connecting either of at least two of the first set of switching voltages to the first voltage rail, wherein the output voltage node of the flying capacitor driver may, in use, coupled to one of the first and second output nodes via the second voltage rail. In some implementations, the switch network may further comprise switches for selectively connecting the first and second driver output nodes respectively to one of the first set of switching voltages which is different to the voltages that can be selectively connected to the first voltage rail.

The controller may be operable: in a first mode in which each of the first and second driver output nodes is switched between first and second supply voltages of the first set of switching voltages; in a second mode in which one of the first and second driver output nodes is switched between said first and second supply voltages and the other one of the first and second driver output nodes is connected to the output voltage node of the flying capacitor driver which operates to switch the voltage output node between the first supply voltage and the boosted voltage; and in a third mode in which one of the first and second driver output nodes is switched between the second supply voltage and a third supply voltage of the first set of switching voltages. The driver apparatus may comprise a DC-DC converter configured to generate said third supply voltage from said first and second supply voltages.

In some examples, the driver apparatus may further comprise a second flying capacitor driver. The controller may be operable to control the first and second flying capacitor drivers together to modulate the first output node between the boosted voltage generated by the first flying capacitor driver and an additional boosted voltage generated by the second flying capacitor driver.

In some examples, the first set of switching voltages, and the boosted voltage generated by the flying capacitor driver, may together form a set of equally spaced voltage levels. In some examples, the first set of switching voltage levels may comprise a received ground voltage, a received positive supply voltage and a boosted voltage equal to twice the received positive supply voltage.

The driver apparatus may be an audio driver apparatus for driving an audio output transducer based on an audio input signal. Embodiments also relate to an integrated circuit comprising the driver apparatus and to an electronic device comprising the driver apparatus.

In another aspect, there is provided a driver apparatus for driving a transducer based on an input signal comprising:
  a first driver output node for outputting a first drive signal;
  a switch network;
  a flying capacitor driver having an output voltage node for connection, in use, to a first terminal of a flying capacitor, the flying capacitor driver being operable in use to selectively switch a second terminal of the flying capacitor between two different voltages to modulate the voltage at the output voltage node; and
  a controller;
  wherein the switch network is operable to selectively connect the first driver output node to the output voltage node of the flying capacitor driver or to any of a first set of at least three different switching voltages, wherein the switching voltages of the first set are, in use, maintained at a respective voltage node throughout a switching cycle of the driver apparatus; and
  wherein the controller is configured to control the switch network and flying capacitor driver to generate the first drive signal at the first driver output node based on the input signal.

In another aspect, there is provided a driver apparatus for driving a transducer based on an input signal comprising: a first driver output node for outputting a first drive signal; a switch network operable in a direct mode to selectively connect the first driver output node to any of a first set of at least three different continuous voltages; wherein the switch network is further operable in an indirect mode to connect the output node to a flying capacitor so as to drive the output node to a voltage boosted by the flying capacitor.

In another aspect, there is provided a transducer driver configured to receive an input signal and first and second supply voltages and to generate an output signal for driving the transducer driver comprising: a combined charge pump and driver operable, in use, with at least one primary capacitor to selectively provide at least a first generated voltage based on the first and second supply voltages; a flying-capacitor driver operable, in use, with at least one secondary capacitor to provide at least a second generated voltage based on the first and second supply voltages; and an output bridge configured to selectively receive the first and second supply voltages, the first generated voltage and the second generated voltage to generate the output signal based on the input signal.

The combined charge pump and driver may be operable, in use, with first and second primary capacitors. The flying-capacitor driver is operable, in use, with first and second secondary capacitors.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
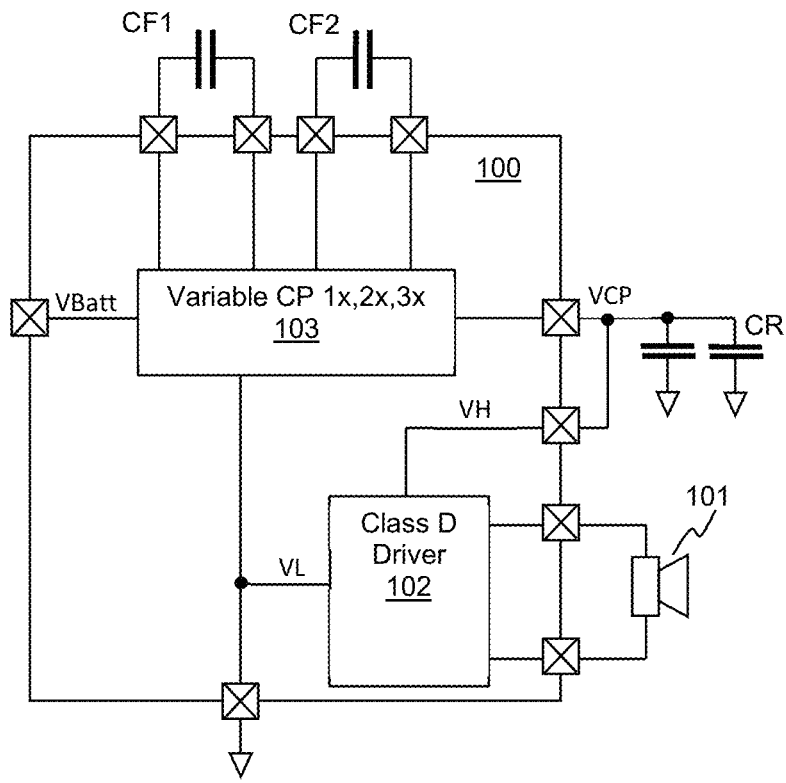
FIG. 1 illustrates one example of a known driving circuit for driving a load.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to driver circuitry for driving a transducer and, in particular, to switching driver circuitry in which an output node can be switched between different switching voltages with a controlled duty cycle. Embodiments of the disclosure also relate to methods of operation of driver circuitry.

In embodiments of the disclosure, a driver apparatus may comprise a switch network configured to selectively switch an output node between any of first set of a plurality of switching voltages, where the first set of voltages are different to one another and, in use, the relevant switching voltage is maintained at a corresponding switching voltage node substantially continuously throughout the whole of the switching cycle of the driver. In use, the output node may be switched between different switching voltages of the first set with a controlled duty cycle so as to generate an output drive signal.

At least one of the first set of switching voltages may comprise a system voltage, i.e. a defined DC voltage that is provided to the driver apparatus, such as an input supply or reference voltage. For example, the first set of switching voltages may comprise a positive input supply voltage, such as a battery voltage, received by the driver apparatus and/or a defined ground reference. At least one of first set of switching voltages may also include at least one supply voltage generated by a DC-DC converter of the driver apparatus, e.g. from a charge pump or inductive boost converter or the like, which may be powered by the input power supply voltages. In some embodiments, the first set of switching voltages may comprise at least three switching voltages.

The voltages of the first set of switching voltages may, in use, be maintained at respective switching voltage nodes and the output node may be switched between selected ones of the first set of switching voltage nodes to provide the desired voltage modulation at the output node.

In addition, the output node can be selectively connected to an output voltage node of a flying capacitor driver. The flying capacitor driver is configured for use with a first terminal of the flying capacitor connected to the output voltage node and is operable to switch a second terminal of the flying capacitor between two different voltages, which may comprise one or more of the system voltages, to modulate the voltage at the output voltage node. The flying capacitor driver may be configured such that at least one of the voltages generated at the output voltage node, in use, is an additional voltage which is different to any of the switching voltages of the first set. It will be understood that this additional voltage is generated in a discontinuous manner, i.e. the additional voltage may be generated for only part of the switching cycle of the driver apparatus. Conveniently the other voltage to which the output voltage node of the flying capacitor driver is modulated is the same as one of the voltages of the first set of voltage. When the output node is connected to the output voltage node of the flying capacitor driver, the flying capacitor driver may be switched with a controlled duty cycle based on the input signal so as to modulate the voltage driver output node.

Figure 2:
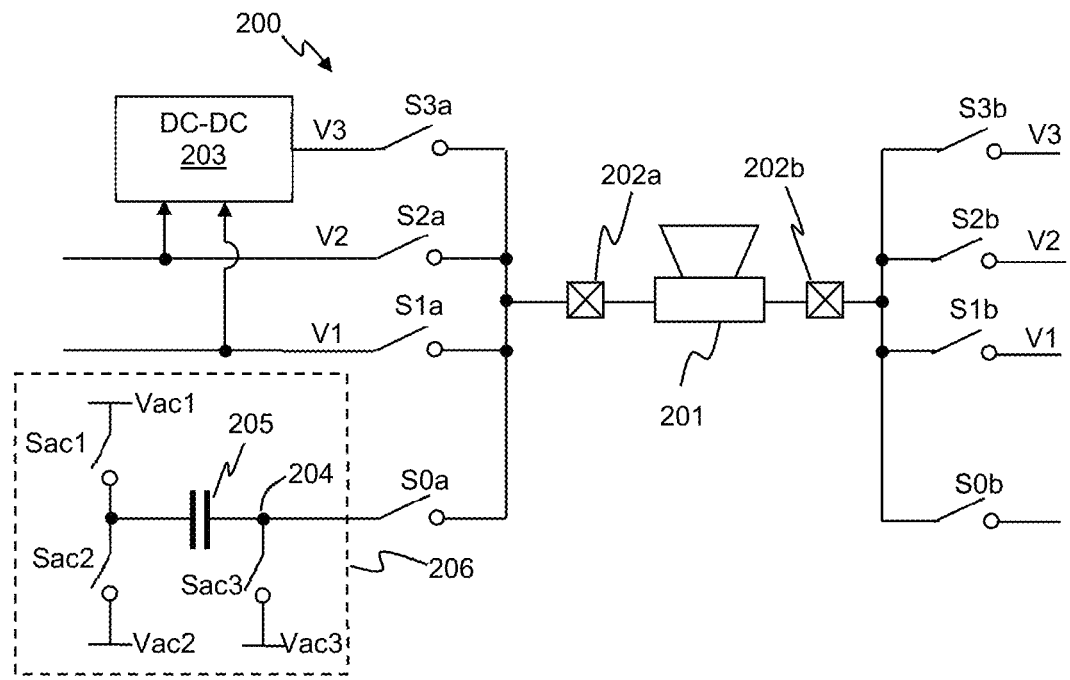
FIG. 2 illustrates the principles of a switching driver according to an embodiment.

FIG. 2 illustrates the principles of a driver apparatus 200 for driving a load 201 according to an embodiment. FIG. 2 illustrates that an output node 202a can be selectively connected, via switching paths S1a, S2a and S3a, to any of three supply voltages V1, V2 or V3, at respective switching voltage nodes.

FIG. 2 illustrates that the voltages V1 and V2 may be system voltages, which as used herein shall refer to any generally continuous voltage maintained or generated by other components, and which is received by/available to the driver apparatus. For example V1 and V2 could be ground and a received input supply voltage +VDD (or −VDD). The input supply voltage V2 may be derived from a system battery voltage, possibly with some voltage regulation and/or boosting applied by some other upstream circuitry and/or the input supply voltage could be provided from a system power supply, such as a switched mode-power supply. Switching path S1a selectively connects the output node 202a to the received voltage V1 and switching path S2a selectively connects the output node 202a to the received voltage V2.

A third, different, supply voltage V3 is generated by a DC-DC converter 203, which may comprise a charge pump or an inductive converter or the like. In this example the DC-DC converter may generate the voltage V3 using the received system voltages V1 and V2. The output node 202a can be selectively connected to the supply voltage V3 output by the charge pump by switching path S1a.

Each of the voltages V1, V2 and V3 is, in use, maintained in a substantially continuous manner, that is, the relevant voltage is maintained at a substantially constant level and the voltage at the relevant switching node thus does not substantially vary over the course of a full switching cycle of the driver apparatus 200. Where the DC-DC converter is a switched mode converter, such as a charge pump, the DC-DC converter is operable to maintain the supply voltage throughout a full switching cycle of the DC-DC converter.

The voltages at the relevant switching node is thus substantially independent of the input signal for the driver apparatus. It will, of course, be understood that the output voltage of a DC-DC converter such as a charge pump or inductive boost converter or the like may exhibit some voltage ripple due to the operation of the DC-DC converter, but the extent of such ripple is relatively small and a switched DC-DC converter such as a charge pump generally comprises an energy storage element such as a reservoir capacitor to maintain the output voltage throughout the whole of switching cycle of the DC-DC converter.

It should be noted that the voltage V3, generated by the DC-DC converter is generated in a substantially continuous manner when the DC-DC converter is active. This does not, however, mean that the DC-DC converter need be continuously active. If, for instance, the supply voltage generated by the DC-DC converter is only used for switching for relatively high magnitude output signals, in some cases the DC-DC converter may be controlled to be inactive if the signal magnitude is relatively low. However, when active, the DC-DC converter operates to maintain its output supply voltage V3 in a continuous manner.

The voltages V1, V2 and V3 provide a first set of switching voltages and, in use, the output node 202a may be switched between a selected pair of these switching voltages with a controlled duty cycle so as to provide the desired output signal. The output node 202a is switched between these voltages by controlling the relevant switching paths S1a, S2a and S1a to connect the output node to the relevant supply voltages with a controlled duty-cycle. Such operation can be seen as direct-coupled switching, or a direct charge transfer mode of operation, as the output node 202a is switched to be directly coupled to the relevant DC voltage supplies. As noted above, the DC supply voltages may, for example, be derived from a battery, an inductive switched mode power supply, or a switched capacitor power supply and maintain the voltage in substantially continuous fashion, i.e. are generally able to supply current for an extended period of time, for example greater than the period of the output drive signal at the lowest needed frequency. The terms "direct-coupled" and "DC-coupled" shall be used herein to refer to such switching of the output node between such supply voltages.

In addition, the output node 202a may be selectively coupled, via switching path S0a, to an output voltage node 204 of a flying capacitor driver 206. The output voltage node 204 is coupled to a first terminal of a capacitor 205. The second terminal of capacitor 205 is configured to be selectively switched between two different voltages Vac1 and Vac2 by switches Sac1 and Sac2. The first terminal of the capacitor 205 may also be selectively connected to a voltage Vac3, by switch Sac3. In use, the capacitor 205 may be cyclically charged and then connected to provide voltage boosting (positive or negative) of one of the voltages Vac1 and Vac2 to generate a boosted voltage at the switching voltage node and thus the capacitor 205 is used as a flying capacitor. The voltages Vac1, Vac2 and Vac3 may, in some implementations, be selected such that the boosted voltage generated at the output voltage node 204 is different to any of the voltages V1, V2 and V3. The voltage Vac1 is different to the voltage Vac2 and, if the switches Sac1 and Sac3 are operated in phase with one another, then Vac1 and Vac3 are also different from one another so that the capacitor 205 is charged by the voltage difference between Vac1 and Vac3 when both these switches are closed. Vac2 and Vac3 may be the same as one another or different. It will be understood that Vac1 may be more or less positive than Vac2 and/or Vac3. Conveniently at least one, and possibly all, of the voltages Vac1, Vac2 and Vac3 is provided by the supply voltage V1, V2 and V3, but any other system voltage could be used to provide one or more of these voltages.

For example, consider that the supply voltage V2 is used for Vac1 and that the supply voltage V1 is used for both Vac2 and Vac3, with the supply voltage V2 being more positive than V1. In use, in one state with the second terminal of the capacitor 205 connected to Vac1=V2 and the first terminal of the capacitor 205 connected to Vac3=V1, the capacitor is charged to a voltage +(V2−V1) with the positive plate at the second terminal. In this state the output voltage node 204 is at the voltage Vac3=V1. In a second state, the second terminal of the capacitor 205 is instead connected to Vac2=V1 and the first terminal of the capacitor 205 is disconnected from Vac3. In this state the capacitor 205 provides negative boosting of the supply voltage Vac2, which thus generates a negatively boosted voltage V0 at the output voltage node, where V0=−(V2−V1). In this example, the output voltage node 204 can thus be switched between the voltages V1 and V0, with the duty cycle being controlled by the switching of switches Sac1, Sac2 and Sac3. The capacitor 205, together with the switches Sac1, Sac2 and Sac3 can thus be seen as a flying capacitor based auxiliary driver or charge pump 206 for driving the output node.

The capacitor 205 can thus be selectively switched to provide selective boosting to provide a voltage V0, which may be different to the voltages V1, V2 and V3. Such operation can be seen as an indirect-coupled switching, or an indirect charge transfer mode of operation, as, in operation when the voltage V0 is generated, the output node is indirectly coupled to the supply Vac2 via the capacitor. The voltage V0 is not maintained continuously throughout the whole switching cycle of the driver apparatus.

As used herein, the terms "indirect-coupled" or "indirect switching" will be used to refer to such operation and the term "AC-coupled" will also be used to refer to such operation.

The driver apparatus 200 is thus operable in a direct-coupled mode of operation and can switch the output between selected ones of the supply voltages V1, V2, V3 and also operable in an indirect-coupled mode of operation, to generate at least one additional voltage V0. The driver apparatus 200 is thus a mixed direct-coupled and indirect-coupled switching driver. Energy can be transferred to the load 201 via a mix of "DC-coupled" and "AC-coupled" paths according to the required output signal.

The DC supply voltages V1, V2 and V3 and the at least one additional boosted voltage V0 are chosen to provide a desired output voltage range for the single ended drive signal at the output node 202a. The difference between the highest voltage level (i.e. most positive/least negative) and the lowest voltage level (i.e. least positive or most negative) from the voltages V1, V2, V3 and V0 is selected to provide a desired output range for the output drive signal. The other voltages are selected to provide intermediate voltages levels. In use, the driver apparatus 200 may be controlled so as to only switch the output node between adjacent voltage levels.

For instance, if V3>V2>V1>V0 (in terms being more positive), then the output node may be switched between the voltages V2 and V3 with a controlled duty cycle to provide an (average) output voltage at the output node 202a in the range between V2 and V3. To provide a lower (average) output voltage, the output node may be switched between V1 and V2 to provide an (average) output voltage in the range between V1 and V2 or switched between V0 and V1 to provide an average voltage in this range.

Figure 3:
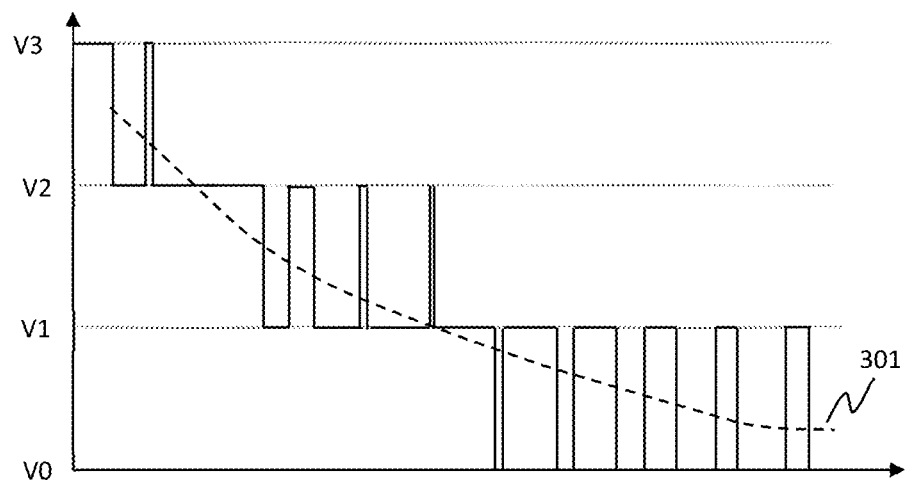
FIG. 3 illustrates switching an output node between multiple different voltage levels.

FIG. 3 illustrates this principle and illustrates the switching waveforms at the output node 202a according to one example and the resulting output voltage 301 (averaged over a duty cycle), i.e. the desired voltage of the drive signal output from the driver apparatus. It should be noted that FIG. 3 illustrates the switching waveforms for a single ended driver signal generated at just one output node, i.e. as would be applied to just one side of the load.

The output voltage 301 at the output node can thus vary within substantially all of a full voltage range defined between V3 and V0. However, across the whole of this output voltage range, the output node is switched between two switching voltages that differ by less than the full voltage range, i.e. the magnitude of the voltage modulation applied to the output node over each switching cycle is less than the full voltage output range.

By contrast, for the switching driver discussed with reference to FIG. 1, generating a drive signal across the full output range would require switching the output node between voltages that differ by the full output range. In embodiments of the present disclosure, a similar output voltage range could be achieved but with a smaller magnitude of voltage modulation at the output node during the switching cycle. This is advantageous in terms of reducing possible electromagnetic interference (EMI), as a lower magnitude of voltage modulation at the output node during the switching cycle can result in lower EMI. In addition, the maximum voltage stress across components of the driver apparatus may depend on the difference between the switching voltages during the switching cycle and using a lower voltage difference may thus ease requirement for voltage stresses across the components, such as switches, of the driver apparatus, which may allow the use of fewer and/or smaller components.

In some cases the voltages levels V1, V2, V3 and V0 may be arranged so that voltage difference between successive voltages levels may be substantially the same as one another. Where V1 and V2 are received system voltages, the voltage V3 may be generated to differ from V1 by an amount equal in magnitude to (V2−V1) and likewise V0 may be generated so as to differ from one of V1, V2 and V3 by the same magnitude. For example, if V1 is ground and V2 is an input voltage VP, then one of V3 and V0 may be generated as 2VP and the other generated as −VP, although other combinations would be possible.

As noted, FIG. 3 illustrates the switching waveforms at one output node only. In some implementations the driver apparatus may be implemented as a single ended driver configured to drive one side of the load only, with the other side of the load being held at a constant defined voltage, e.g. ground or a non-zero quiescent voltage level. However, in some implementations the driver apparatus may be implemented as a differential driver configured to drive both sides of the load.

Referring back to FIG. 2, the driver apparatus may thus also comprise switching paths S1b, S2b and Sib for selectively connecting an output node 202b on the other side of the load to the supply voltages V1, V2 and V3 respectively. There is also a switching path S0b for selectively connecting the output node 202b to a switching voltage node for indirect-coupled switching. In some cases, the switching path S0b may connect the output node 202b to the output voltage node 204, but in some cases, there may be an additional charge pump, similar to charge pump 206, for providing indirectly-coupled switching for the output node 202b. Each of the output nodes 202a and 202b can be selectively switched between appropriate switching voltages to provide a desired differential voltage across the load.

Thus, considering the example of the different voltage levels of FIG. 3, where V3 is the highest (most positive/least negative) voltage and V0 is the lowest (most negative/least positive) voltage, and V2 is higher (more positive/less negative) than V1, a differential voltage in the output range of +(V3−V0) to −(V3−V0) can be generated. For a relatively high magnitude output voltage within this range, the driver apparatus 200 may operate in a mode in which the output node on one side of the load is switched between V2 and V3, whilst the output node on the other side of the load is switched between V0 and V1. For a relatively low magnitude signal within this range, the driver apparatus 200 may operate in a different mode in which each side of the load may be switched between the voltages V1 and V2, with appropriate duty cycles on each side of the load. In some implementations, the driver apparatus 200 may operate in either of these two modes of operation and switch between them when an appropriate signal threshold is reached. However, in some implementations the driver apparatus may also be operable in another mode for intermediate magnitude signals. In the intermediate magnitude mode, the output node on one side of the load may be switched between the voltages V1 and V2 whilst the output node on the other side of the load is switched between V0 and V1. Alternatively (or as an additional intermediate-magnitude mode) the output node on one side of the load may be switched between the voltages V2 and V3, whilst the output node on the other side of the load is switched between V1 and V2. The use of an intermediate-magnitude mode can reduce the need to achieve duty-cycles at or near 100% in the high-magnitude and low-magnitude modes, which may be practically difficult, but the common-mode component of the differential output signal may be different in the intermediate-magnitude mode compared to the high-magnitude or low-magnitude modes.

In the example of FIG. 2, the switching driver 200 thus receives input system voltages V1 and V2, e.g. ground and an input supply voltage VP, and generates an additional supply voltage V3. The switching driver also, when required, generates an additional boosted voltage V0 using the flying capacitor 205.

Driving the load with the boosted voltage V0 generated by the flying capacitor can be relatively power efficient, as charge transferred from the supply to the capacitor is then transferred to the load without significant wastage. However, the duty cycle of switching of the capacitor 205 is dependent on the required output signal voltage and thus is input signal dependent. This results in a duty-cycle dependent impedance variation. A significant signal dependent impedance variation can generally be undesirable.

By using a mix of direct-coupled and indirect-coupled switching, embodiments of the present disclosure provide an advantageous balance between power efficiency and impedance variation. This may also allow use of a reduced number of capacitors compared to the driver illustrated in FIG. 1.

Figure 4:
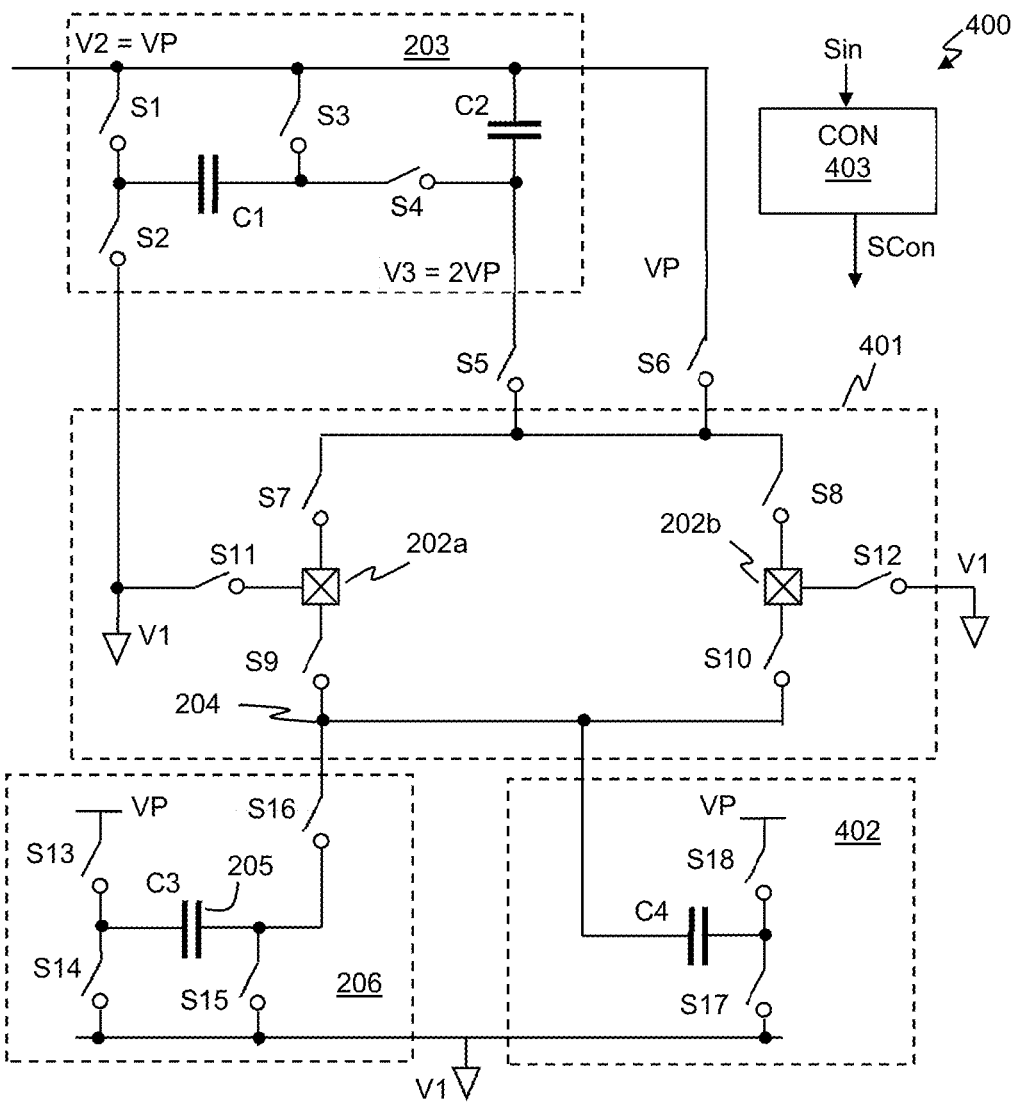
FIG. 4 illustrates one example of a driver apparatus according to an embodiment.

FIG. 4 illustrates one embodiment of a switching driver 400 according to an embodiment in more detail, in which similar components to those discussed with reference to FIG. 2 are identified with the same reference numerals.

The embodiment of FIG. 4 comprises a differential driver for driving output nodes 202a and 202b. The embodiment of FIG. 4 receives systems voltages V1 and V2, which in this example are ground and a supply voltage VP. The driver apparatus comprises a 2× (times two) charge pump 203, which receives the system voltages VP and ground, and which generates a further supply voltage V3, which in this example is equal to 2VP.

The charge pump 203 comprises a capacitor C1 arranged as a flying capacitor with switches S1, S2, S3 and S4. Switches S1 and S2 selectively connect a first terminal of the capacitor C1 to the system voltages VP and ground respectively, whilst switch S3 selectively connects the second terminal to system voltage VP and switch S4 selectively couples the second terminal of capacitor C1 to the charge pump output for the voltage 2VP.

In use, switches S2 and S3 are switched together and in antiphase with switches S1 and S4. The charge pump 203 thus cycles between a first state, with switches S2 and S3 closed (and switches S1 and S4 open), to charge the flying capacitor C1 to the voltage VP with the second terminal being positive, and a second state with switches S1 and S4 closed (and switches S1 and S4 open), such that the system voltage VP is connected to the first terminal of capacitor C1 and the second terminal of capacitor C1 is boosted to 2VP. This state charges the reservoir capacitor C2, connected between the system voltage VP and the charge pump output, and thus provides an output voltage of 2VP, which is maintained by the capacitor C2.

The switches S1 to S4 of the charge pump 203 are switched at a charge pump frequency which is independent of the output signal being output by the driver apparatus, and which is thus independent of the duty cycles at the output nodes 202a and 202b.

The driver apparatus 400 also comprises a differential output bridge 401 for the output nodes 202a and 202b. In the example of FIG. 4, the 2VP output voltage from the charge pump 203 or the system voltage VP may be respectively coupled to a common-rail, which may be referred to as a high-side rail by switches S5 and S6 respectively. Each of the output nodes 202a and 202b may be selectively connected to the high-side rail by respective switches S7 and S8. The output nodes 202a and 202b can also be selectively connected to a low-side rail by respective switches S9 and S10, or to the system ground voltage by respective switches S11 and S12. The output bridge 401 may thus be referred to as a T-bridge.

The driver apparatus also comprises a flying capacitor auxiliary driver 206 as discussed with reference to FIG. 2. In this example, switches S13 and S14 (equivalent to switches Sac1 and Sac2 of FIG. 2) selectively connect the first terminal of capacitor 205 to the system voltage VP or ground respectively, and switch S15 (equivalent to Sac3) selectively connects the second terminal of capacitor 205 to ground.

Switch S11 thus provides the switching path S1a discussed with reference to FIG. 2. Switches S7 and S5 collectively provide the switching path S2a and switches S7 and S6 thus collectively provide the switching path S1a. Switching path S0a is provided by switches S9 and S16.

The embodiment of FIG. 4 also includes a second flying capacitor auxiliary driver 402, which comprises switches S17 and S18 and capacitor C4, which is also connected to the low-side rail. The second flying capacitor auxiliary driver 402 can be implemented so as to operate, together with the first flying capacitor auxiliary driver 206, to generate a further different boosted voltage, as will be described in more detail below, so as to extend to the output voltage range of the driver apparatus 400. In some implementation, however, this further different boosted voltage may not be required and the second flying capacitor auxiliary driver 402 may be omitted.

In use, the various switches S5 to S18 of the driver apparatus are controlled by a controller 403 based on an input signal Sin, for example an input audio signal, to generate a corresponding differential output signal. The controller 403 may be configured to operate the driver apparatus selectively in different modes of operation to provide a differential output voltage in the range of +4VP to −4VP based on the input signal Sin. The controller 403 thus receives the input signal Sin and generates a series of switch control signals Scon for controlling the switches. The controller 403 may also control the switches S1-S4 of the charge pump 203 but the control of these switches may be independent of the input signal Sin.

For a relatively low-magnitude output signal, i.e. for a differential output magnitude below a first threshold, where the first threshold is a magnitude of VP or lower, the driver apparatus 400 can be operated in a first mode in which each of the output nodes 202a and 202b is switched between voltages ground and VP.

In this first mode of operation, switch S6 is closed to connect the input supply voltage VP to the high-side rail and switch S5 is open to disconnect the output of the charge pump 203 from this rail. Switches S9 and S10 are also open to disconnect the output nodes from the low-side rail.

The switches S7 and S11 are switched in antiphase with a controlled duty-cycle to switch the output node between the voltage VP (at the high-side rail) and ground. Likewise the switches S8 and S12 are also switched with a controlled duty cycle for the output node 202b.

Figure 5A:
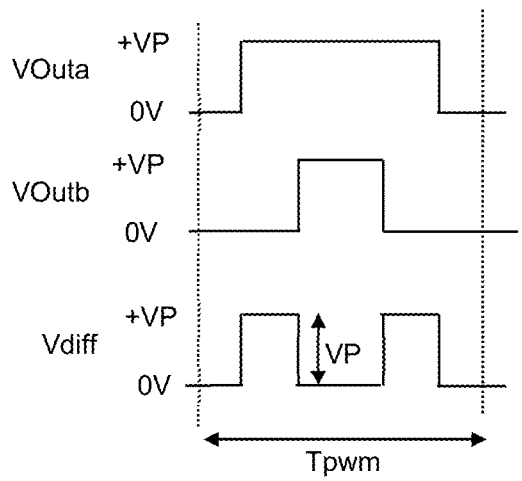
FIGS. 5a to 5d illustrate example switching waveforms for the driver apparatus of FIG. 4 in different operating modes.

Each of the output node 202a and 202b is thus switched between the voltages ground and VP with respective controlled duty cycles to provide the desired output voltage based on the input signal. FIG. 5a illustrates one example of switching waveforms Vouta and Voutb for the output nodes 202a and 202b and the resulting differential voltage Vdiff over one switching cycle period Tpwm.

In this first mode of operation, the switches S1 to S4 of the charge pump may be switched at the charge pump frequency as discussed above to maintain the voltage on capacitor C2. In addition, switches S13 and S15 of the first flying capacitor auxiliary driver 206 may be kept closed so that the capacitor 205 is charged to the voltage VP. Switches S16, S17 and S18 may be kept open, or in some cases switches S16 and S18 could be closed so as to provide some pre-charging of capacitor C4 (which is used in a fourth mode as discussed below).

For a higher intermediate magnitude output signal, i.e. for a differential output magnitude between the first threshold and a second higher threshold, where the second threshold is a magnitude of 2VP or lower, the driver apparatus 400 can be operated in a second mode in which one of the output nodes 202a and 202b (depending on the required polarity) is switched between voltages ground and VP and the other output node is switched between voltages −VP and ground.

If the polarity of the differential output is defined as being positive when the voltage at the output node 202a is more positive than the voltage at the output node 202b, then for a positive output signal in the second mode of operation the output node 202a would be switched between VP and ground, whilst the output node 202b is switched between −VP and ground.

In this case, switch S6 is again closed to connect the input voltage VP to the high-side rail, with switch S5 open, and switches S7 and S11 are again switched with a controlled duty-cycle, whilst switch S9 is open.

In this case switch S10 is closed to connect the output node 202b to the low-side rail, with switches S8 and S12 open. Switch S16 is closed to connect the low-side rail to the first flying capacitor auxiliary driver 206. Switches S13 and S15 are switched together in antiphase with switch S14 with a controlled duty cycle based on the input signal Sin. As described with reference to FIG. 2, with switches S13 and S15 closed (and S14 open) the voltage at node 204, and hence the low-side rail, is ground and the capacitor 205 is charged to VP. With switch S14 closed (and S13 and S15 open) the capacitor 205 is connected between ground and the switching voltage node 104, with its positive plate connected to ground to drive the voltage at the output voltage node 204, and hence the low-side rail to −VP. In this mode the second flying capacitor auxiliary driver 402 is not used and switches S18 and S17 may be held open so that capacitor C4 is left floating, or alternatively the switches could be controlled to maintain some pre-charge on capacitor C4.

Figure 5B:
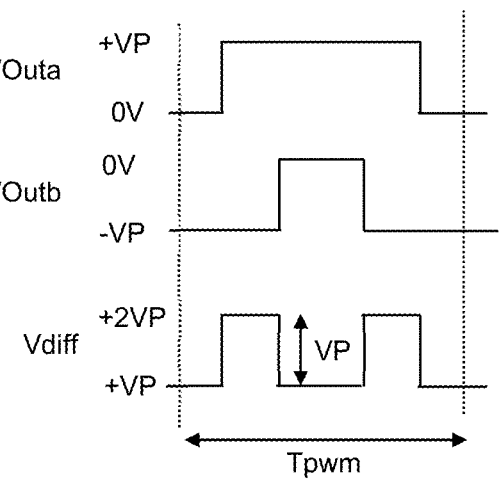

The output node 202a is thus switched between the voltages ground and VP, whilst the output node 202b is switched between the voltage −VP and ground, with respective controlled duty cycles to provide the desired output voltage based on the input signal. FIG. 5b illustrates one example of switching waveforms Vouta and Voutb for the output nodes 202a and 202b and the resulting differential voltage Vdiff over one switching cycle period Tpwm in this second mode of operation for a positive differential output. For a negative differential output, the output node 202a would instead be connected to the low-side rail and output node 202b switched between ground and the high-side rail.

For a still higher intermediate magnitude output signal, i.e. for a differential output magnitude between the second threshold and a third higher threshold, where the third threshold is a magnitude of 3VP or lower, the driver apparatus 400 can be operated in a third mode in which one of the output nodes 202a and 202b (depending on the required polarity) is switched between voltages VP and 2VP and the other output node is switched between voltage −VP and ground.

For a positive differential output, the output node 202a may be switched between the voltages VP and 2VP. In this case, switch S7 is closed throughout the switching cycle to connect the output node to the high-side rail (with switches S9 and S11 open) and the switches S5 and S6 are switched with a controlled duty cycle to switch the voltage at the high-side rail between VP and 2VP. The output node 202b is connected to the low-side rail by switch S10 and the flying capacitor auxiliary driver 206 operates in the same manner as in the second mode.

Figure 5C:
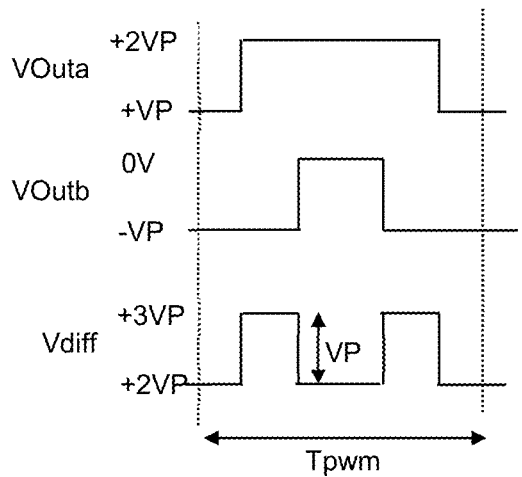

The output node 202a is thus switched between the voltages VP and 2VP, whilst the output node 202b is switched between the voltage −VP and ground, with respective controlled duty cycles to provide the desired output voltage based on the input signal. FIG. 5c illustrates one example of switching waveforms Vouta and Voutb for the output nodes 202a and 202b and the resulting differential voltage Vdiff over one switching cycle period Tpwm in this third mode of operation for a positive differential output. For a negative differential output, the output node 202a would instead be connected to the low-side rail and output node 202b connected to the high-side rail.

For a still higher magnitude output signal, i.e. for a differential output magnitude above the third threshold, the driver apparatus 400 can be operated in a fourth mode in which one of the output nodes 202a and 202b (depending on the required polarity) is switched between voltages VP and 2VP and the other output node is switched between voltage −2VP and −VP.

For a positive differential output, the output node 202a may be switched between the voltages VP and 2VP. In this case, switch S7 is closed throughout the switching cycle to connect the output node to the high-side rail (with switches S9 and S11 open) and the switches S5 and S6 are switched with a controlled duty cycle to switch the voltage at the high-side rail between VP and 2VP in a similar fashion as in the third mode.

The output node 202b is connected to the low-side rail with switch S10 closed (and switches S8 and S12 open). In this case, the first flying capacitor auxiliary driver 206 cooperates with the second flying capacitor auxiliary driver 402 to switch the voltage at the low-side rail between −VP and −2VP. These auxiliary drivers are controlled between two states with a controlled duty cycle based on the input signal Sin.

In the first state, switches S14 and S16 are closed (with switches S13 and S15 open). The capacitor 205, charged to VP, is thus connected between ground and the low-side rail, with the positive plate connected to ground. This drives the low-voltage rail, and hence the output node 202b to a voltage −VP. In this first state switch S18 is also closed, with switch S17 open, so that capacitor C4 is charged to a voltage of 2VP.

In the second state, switch S16 is open to isolate the first flying capacitor auxiliary driver 206 from the low-side rail, and switch S17 is closed (with switch S18 open) to connect capacitor C4 between ground and the low-side rail, with its positive plate connected to ground. This drives the low-side rail to −2VP. In this first state, switches S13 and S15 may also be closed, with switch S14 open, to recharge the capacitor 205.

Thus, in the fourth mode, the first flying capacitor auxiliary driver acts as a helper charge pump for the second flying capacitor auxiliary driver.

Figure 5D:
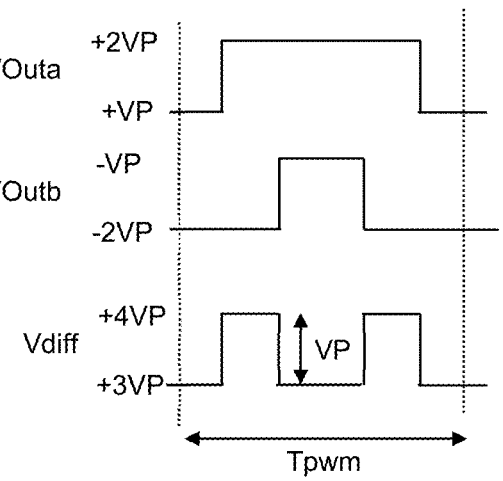

The output node 202a is thus switched between the voltages VP and 2VP, whilst the output node 202b is switched between the voltages −2VP and −VP, with respective controlled duty cycles to provide the desired output voltage based on the input signal. FIG. 5d illustrates one example of switching waveforms Vouta and Voutb for the output nodes 202a and 202b and the resulting differential voltage Vdiff over one switching cycle period Tpwm in this fourth mode of operation for a positive differential output. For a negative differential output, the output node 202a would instead be connected to the low-side rail and output node 202b connected to the high-side rail.

It will be seen from FIGS. 5a to 5d that in each of these first to fourth modes of operation, the voltage modulation at each of the output nodes over the course of the switching period has a magnitude equal to the input voltage VP (i.e. equal to V2−V1). In addition, the magnitude of the modulation of the differential voltage is, in each of these modes, limited to this voltage VP.

The controller 403 therefore receives the input signal Sin and generates appropriate control signals Scon for the switches of the driver apparatus 400 to provide a corresponding output signal. Depending on the signal magnitude, the controller operates in the appropriate mode and controls the duty cycles on both sides of the load. As the input signal varies, the controller controllably adjusts the duty cycles accordingly within a given mode of operation, until a threshold for changing mode is reached, at which point the controller 403 transitions to the new mode of operation, with appropriate changes in duty cycle to account for the change in switching voltages and maintain the correct differential voltage.

Figure 6:
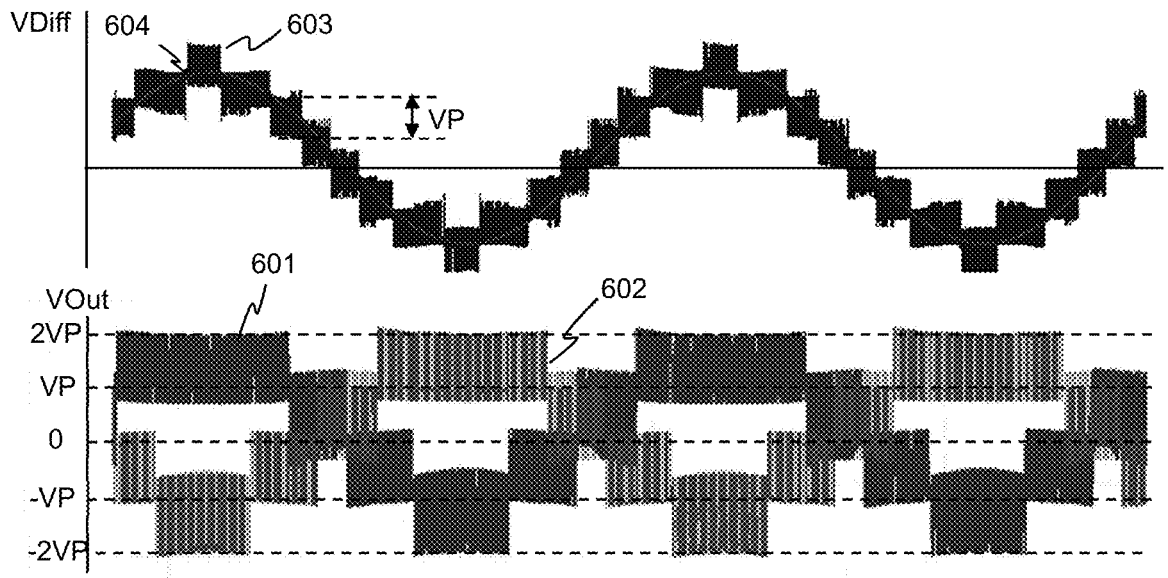
FIG. 6 illustrates example switching waveforms for the driver apparatus of FIG. 4 as the required output signal varies.

FIG. 6 illustrates examples waveforms for a switching driver apparatus such as illustrated in FIG. 4 as the output signal varies. The waveforms 601 and 602 illustrate the voltages Vouta and Voutb at the output nodes 202a and 202b respectively. Waveform 603 illustrates the unfiltered differential voltage across the load and waveform 604 illustrates the resulting average differential output, i.e. the differential output signal as experienced by the load after filtering.

The driver apparatus 400 may be implemented using FET devices for the switches.

Figure 7:
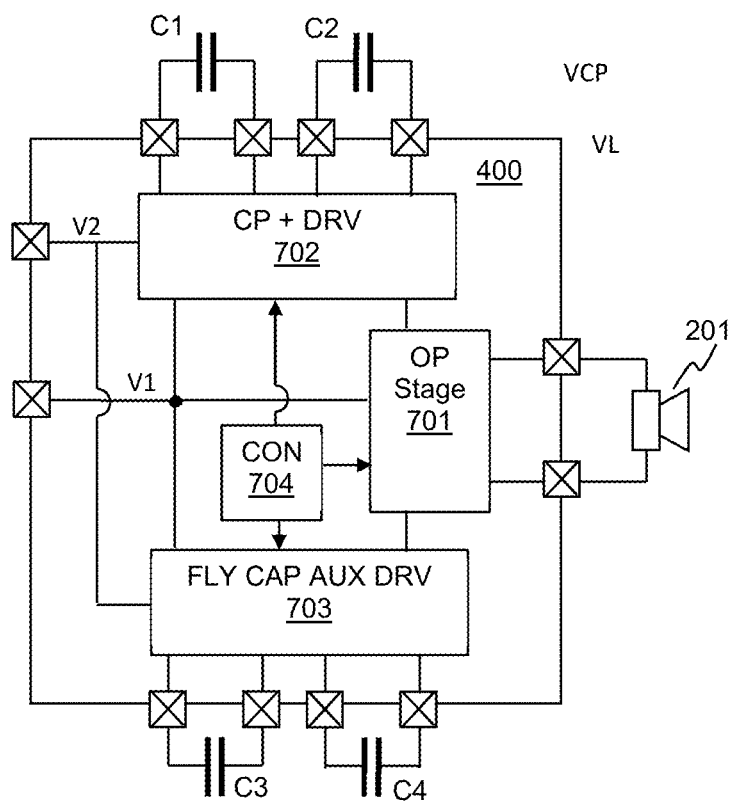
FIG. 7 illustrates generally an embodiment of a driver apparatus.

In general, as illustrated in FIG. 7 the driver apparatus 400 according to this embodiment can be seen receiving system (or supply) voltages V1 and V2, where V1 may be ground or some other defined reference and V1 may be an input supply. An output bridge 701, such as the output bridge 401 discussed with reference to FIG. 2, is configured for outputting a signal to a load 201, e.g. a transducer. A combined charge pump and driver 702 is operable, to selectively provide at least a first generated voltage V3. In this example, the combined charge pump and driver 702 is operable, to selectively provide the received supply voltage V2 and at least one generated boosted voltage V3 to the output stage 701 for DC-coupled switching. The combined charge pump and driver 702 may thus comprise charge pump functionality to generate a boosted voltage from the received supply voltages and driver capability so as to drive the output bridge between different switching voltages with a controlled duty cycle so as to generate the output signal. The combined charge pump and driver 702 is operable, in use, with a at least one capacitor, which may be referred to as a primary capacitor. In the example of FIG. 7, there may be first and second primary capacitors C1 and C2, which in some cases could be integrated capacitors, but in some cases may be off-chip components.

The first and second primary capacitors may be configured as flying and reservoir capacitors respectively. The combined charge pump and driver may comprise the charge pump 203 discussed with reference to FIG. 4, along with the switches S5 and S6 for providing a selected output to the high-side rail.

A flying capacitor auxiliary driver is also operable to provide at least a second generated voltage. The flying capacitor auxiliary driver 703 may be configured to provide a voltage V0 by indirect-coupled or AC coupled switching, e.g. through use of a flying capacitor. The combined charge pump and driver 703 may thus comprise driver capability so as to drive the output bridge between different switching voltages with a controlled duty cycle by switching of a flying capacitor. The flying capacitor driver 703 is operable, in use, with at least one capacitor, which may be referred to as a secondary capacitor. In the example of FIG. 7, there may be first and second secondary capacitors C3 and C4, which again could be integrated or off-chip components. Both of the first and second secondary capacitors C3 and C4 may be configured as flying capacitors. The flying capacitor auxiliary driver 703 may comprise the first and second flying capacitor auxiliary drivers 206 and 403 discussed with reference to FIG. 4. The output bridge is configured to selectively receive the first and second supply voltages, V1 and V2, the first generated voltage V3 and the second generated voltage V0 to generate the output signal based on the input signal. A controller 704 controls the switching operation of the output stage 701, combined charge pump and driver 702 and flying capacitor auxiliary driver 703 based on an input signal (not separately illustrated).

Figure 8:
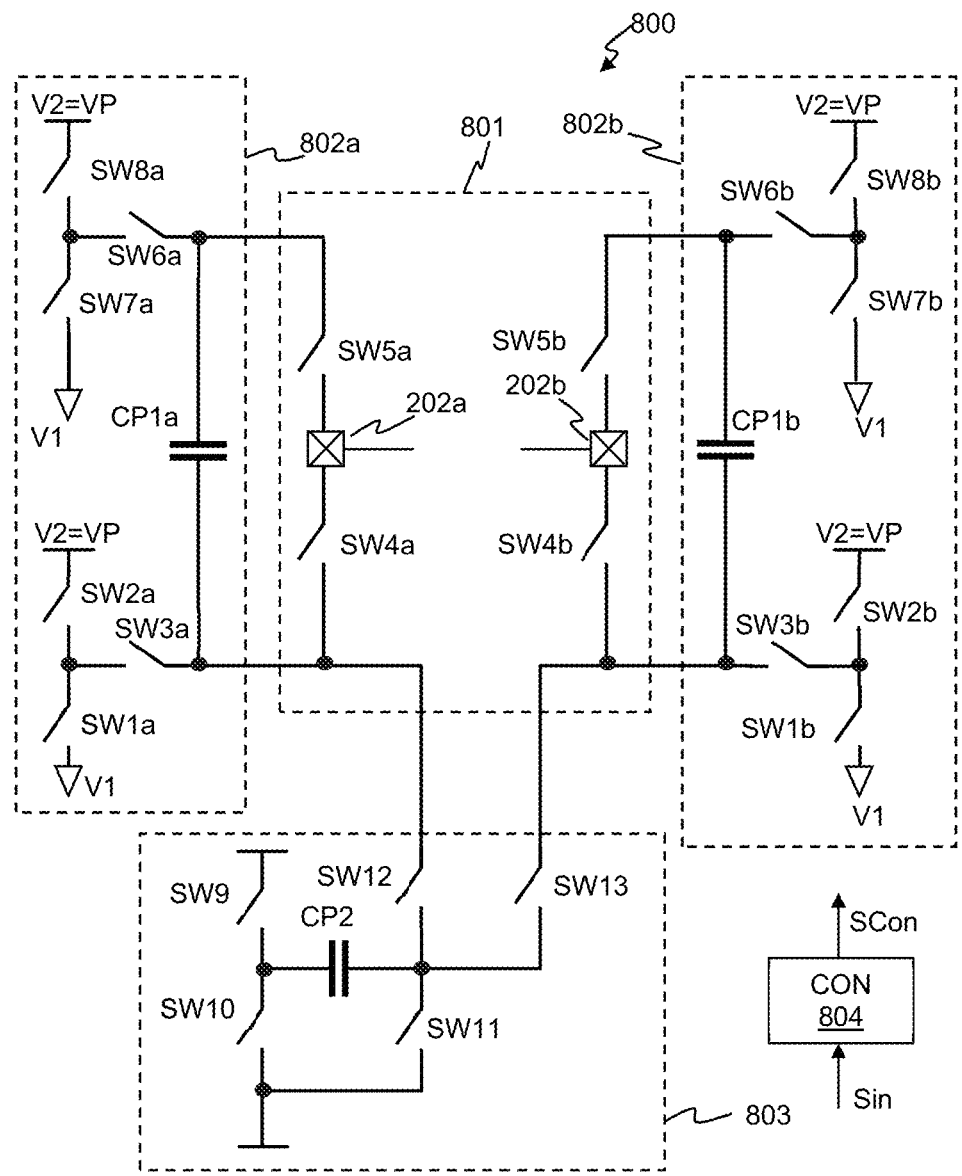
FIG. 8 illustrates one example of a driver apparatus according to another embodiment.

FIG. 8 illustrates an example of a driver apparatus 800 according to another embodiment.

The embodiment of FIG. 8 comprises a differential driver for driving output nodes 202a and 202b. The embodiment of FIG. 4 receives systems voltages V1 and V2, which in this example are ground and a supply voltage VP.

The switching apparatus 800 comprises an output stage 801 for driving the output nodes 202a and 202b. The output stage 801 in this embodiment comprises switches SW5a and SW5b for selectively connecting the output node 202a to respective high-side and low side-rails for the output node 202a. Likewise switches SW4b and SW5b selectively connect the output node to high-side and low-side rails for output node 202b. The output stage 801 in this example may thus be seen as an H-bridge.

A driver 802a is operable to provide voltages for the high-side and low-side rails for output node 202a. The driver 802a comprises a capacitor CP1a coupled between the high-side and low-side voltage rails. A switch SW6a selectively couples the high-side voltage rail to a voltage select node which can be selectively connected to either of the system voltages V1 or V2, i.e. ground and VP in this example, by switches SW7a and SW8a. Likewise, SW3a selectively couples the low-side voltage rail to a voltage select node which can be selectively connected to either of the system voltages V1 or V2 by switches SW1a and SW2a.

In use, the driver 802a can supply the system voltages V2 and V1 as voltages to the high-side and low-side rails for DC-coupled switching. In addition, the driver 802a can selectively connect the capacitor CP1a in series with one of these supply voltages to provide positive or negative boosting of the relevant supply voltage to provide an indirect (or AC coupled) switching voltage, as will be described in more detail below.

A driver 802b is coupled to the high-side and low-side rails for the output node 202b. The driver 802b has generally the same structure as the driver 802a and thus has components corresponding those of the driver 802a (identified by the same reference but with the suffix b in FIG. 8).

The driver apparatus 800 also comprises a charge pump 803. The charge pump 803 is configured to be operable to provide a supply voltage to, in this example, the low-side rail for either of the output nodes 202a or 202b. The charge pump driver 803 comprises a capacitor CP2 and switches S9 and S10 for selectively connecting a first terminal of capacitor CP2 to either of the system voltages V2 or V1, and switch SW11 for selectively connecting a first terminal of capacitor CP2 to V1, i.e. ground in this example. Switches SW12 and SW13 selectively connect the charge pump driver to the low-sides rails for output nodes 202a and 202b respectively. In use, when the charge pump 803 is active to supply a voltage to one of the low side rails, the respective capacitor CP1a or CP2b connected to that voltage rail may be used as a reservoir capacitor, as will be discussed in more detail below.

In use, the various switches of the driver apparatus are controlled by a controller 804 based on an input signal Sin, for example an input audio signal, to generate a corresponding differential output signal. The controller 804 may be configured to operate the driver apparatus selectively in different modes of operation to provide a differential output voltage in the range of +3VP to −3VP based on the input signal Sin. The controller 804 thus receives the input signal Sin and generates a series of switch control signals Scon for controlling the switches.

For a relatively low-magnitude output signal, i.e. for a differential output magnitude below a first threshold, where the first threshold is a magnitude of VP or lower, the driver apparatus 800 can be operated in a first mode in which each of the output nodes 202a and 202b is switched between voltages which are ground and VP.

In the first mode, for driver apparatus 800, switches SW1a, SW3a, SW8a and S6a are also closed (with switches SW2a and SW7a open) to connect the high-side and low-side voltage rails of driver 802a to the voltage VP and ground respectively, and the corresponding switches of driver 802b are switched in the same way. The switches SW4a and SW5a are switched in antiphase with a controlled duty-cycle to switch the output node 202a between the voltage VP at the high-side rail and ground at the low-side rail. Likewise the switches SW4b and SW5b are also switched with a controlled duty cycle for the output node 202b.

Figure 9A:
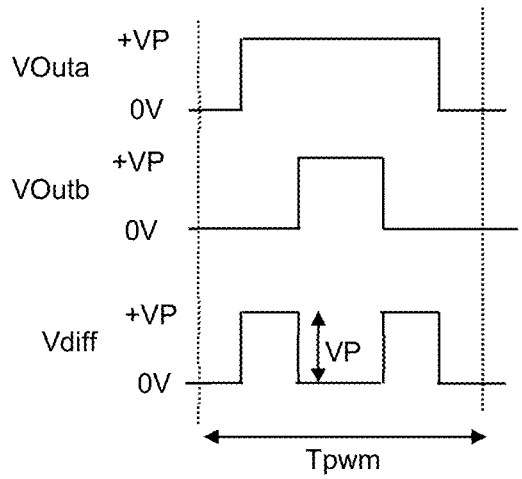
FIGS. 9a to 9d illustrate example switching waveforms for the driver apparatus of FIG. 8 in different operating modes.

Each of the output nodes 202a and 202b is thus switched between the voltages ground and VP with respective controlled duty cycles to provide the desired output voltage based on the input signal. FIG. 9a illustrates one example of switching waveforms Vouta and Voutb for the output nodes 202a and 202b and the resulting differential voltage Vdiff over one switching cycle period Tpwm.

In additional, as the capacitors CP1a and CP1b are connected between the respective high-side and low-side rails of the relevant driver, each of these capacitors is charged to the voltage VP.

In this first mode of operation, switches SW12 and SW13 are open to disconnect the charge pump 803 from the low-side rails. Switches SW9 and SW11 may be closed, with switch SW10 open, to charge the capacitor CP2 to a voltage VP.

For a higher intermediate magnitude output signal, i.e. for a differential output magnitude between the first threshold and a second higher threshold, where the second threshold is a magnitude of 2VP or lower, the driver apparatus 800 can be operated in a second mode in which one of the output nodes 202a and 202b (depending on the required polarity) is switched between voltages ground and VP and the other output node is switched between −VP and ground.

If the polarity of the differential output is defined as being positive when the voltage at the output node 202a is more positive that the voltage at the output node 202b, then for a positive output signal in the second mode of operation the output node 202a would be switched between ground and VP, whilst the output node 202b is switched between −VP and ground.

In this case, driver 802a may be operated in the same way as in the first mode. For driver 802b, switch SW4b may be closed, with switch SW5b open, to connect the output node 202b to the low-side rail. In this mode, the driver 802a may cycle between two states with a controlled duty-cycle to vary the voltages at the low-side voltage rail. In one state, switches SW1b, SW3b, SW6b and SW8b may be closed (with switches SW2b and SW7b open) so that the low-side rail is driven to ground and the capacitor CP1b is charged to a voltage of VP. In the other state, switches SW6b and SW7b are closed (with switches SW1b, SW2b, SW3b and SW8b open) so that the capacitor CP1b is connected between V1, ground in this example, and the low-side rail with its positive plate connected to V1. This provides negative boosting of the voltage V1 and, in this example, drives the low-side rail to the voltage −VP.

The driver 802b in this mode thus provides an indirect-coupled switching voltage, with the advantages of power efficiency discussed above.

Figure 9B:
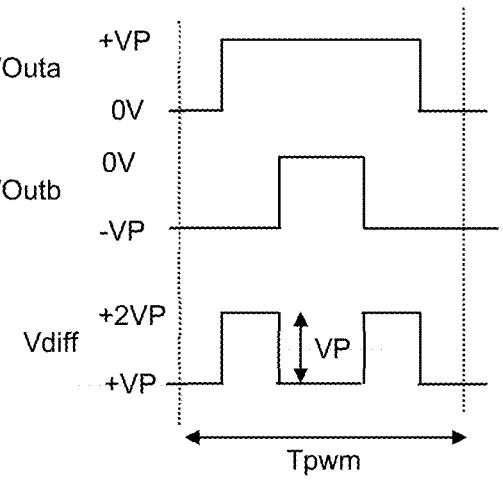

The output node 202a is thus switched between the voltages ground and VP, whilst the output node 202b is switched between the voltage −VP and ground, with respective controlled duty cycles to provide the desired output voltage based on the input signal. FIG. 9b illustrates one example of switching waveforms Vouta and Voutb for the output nodes 202a and 202b and the resulting differential voltage Vdiff over one switching cycle period Tpwm in this second mode of operation for a positive differential output. For a negative differential output, the operation of the drivers 802a and 802b would be swapped.

Again, in this second mode of operation for the driver apparatus, switches SW12 and SW13 are open to disconnect the charge pump 803 from the low-side rails and switches SW9 and SW11 may be closed, with switch SW10 open, to charge the capacitor CP2 to a voltage VP.

For a still higher intermediate magnitude output signal, i.e. for a differential output magnitude between the second threshold and a third higher threshold, where the third threshold is a magnitude of 3VP or lower, the driver apparatus 800 can be operated in a third mode in which one of the output nodes 202a and 202b (depending on the required polarity) is switched between voltages VP and 2VP and the other output node is switched between voltage −VP and ground.

For a positive differential output, the output node 202a may be switched between the voltages VP and 2VP. In this case, switch SW5a may be closed throughout the switching cycle to connect the output node 202a to the high-side rail (with switch SW4a open). The driver 802a then cycles between two states with a controlled duty cycle so as to modulate the voltage at the high-side rail between VP and 2VP.

In one state, switches SW1a, SW3a, SW6a and SW8a are closed (with switches SW2a and SW7a open) to connect the high-side rail to the voltage VP and to charge the capacitor CP1a to the voltage VP. In the other state, switches SW2a and SW3a are closed (with switches SW1a, SW6a, SW7a and SW8a open) to connect the capacitor CP1a between the voltage V2, i.e. VP in this example, and the high-side rail, so as to provide a boosted voltage at the high-side rail, equal to +2VP in this example.

In this mode of operation, the driver 802a thus operates to provide an indirect-coupled positive boosted voltage of 2VP.

The driver 802b may operate in the same way as the second mode.

Figure 9C:
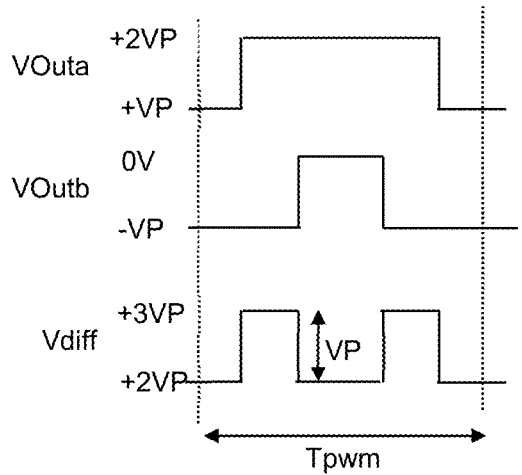
Figure 9D:
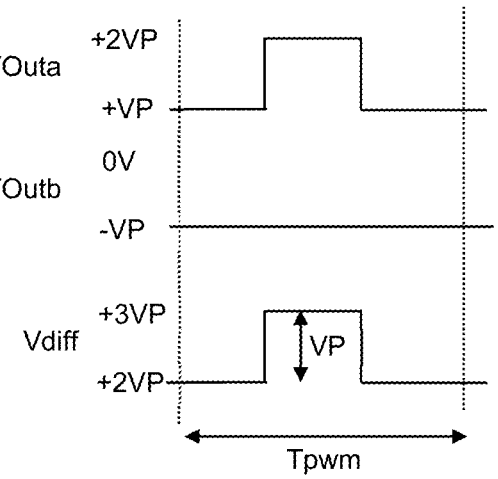

The output node 202a is thus switched between the voltages VP and 2VP, whilst the output node 202b is switched between the voltage −VP and ground, with respective controlled duty cycles to provide the desired output voltage based on the input signal. FIG. 9c illustrates one example of switching waveforms Vouta and Voutb for the output nodes 202a and 202b and the resulting differential voltage Vdiff over one switching cycle period Tpwm in this third mode of operation for a positive differential output. For a negative differential output, the output node 202a would instead be switched between −VP and ground and output node 202b switched between +VP and +2VP.

Again, in this third mode of operation for the driver apparatus 800, switches SW12 and SW13 are open to disconnect the charge pump 803 from the low-side rails and switches SW9 and SW11 may be closed, with switch SW10 open, to charge the capacitor CP2 to a voltage VP.

In this third mode of operation for the driver apparatus 800, the drivers 802a and 802b on both sides of the load are operating in an indirect-coupled mode to generate an indirect-coupled boosted voltage.

As discussed above, whilst such indirect-coupled switching can be power efficient, it can result in an undesirable duty-cycle dependent impedance variation. This impedance variation is dependent on duty-cycle, and the extent of the variation depends on the proportion of time the relevant AC-coupled boosted voltage is connected to the output node.

To reduce this variation, the driver apparatus 800 is also operable in a fourth mode when the differential output magnitude between the second threshold and third thresholds. In the fourth mode, one of the output nodes 202$a$ and 202$b$ (depending on the required polarity) is switched between voltages VP and 2VP but the other output node is held constant throughout the switching cycle at the voltage −VP. The voltage −VP is generated by the charge pump 803 at the low-side rail for the relevant output node.

The controller may operate in the fourth mode when the differential output magnitude is between the second threshold and third thresholds, and where, for the relevant output node that would otherwise be switching between −VP and ground, the proportion of the switching cycle that would be spent at the indirect-coupled boosted voltage −VP would be above a threshold. For example, the threshold could be 50%. Thus, if the relevant output node would spend 50% or more of the switching cycle connected to −VP if operating in the third mode (which corresponds, in this case, to a duty cycle for that output node of less than 0.5), the controller 804 can control the driver apparatus to operate in the fourth mode instead.

For a positive differential output, the output node 202$a$ may be switched between the voltages VP and 2VP and the output node 202$b$ may be held static at the voltage −VP. The driver 802$a$ may thus be operated in the same way as in the third mode.

To generate the static voltage −VP, switch SW4$b$ is closed, with switch SW5$b$ open, to connect the output node 202$b$ to the low-side rail. Switches SW6$b$ and SW7$b$ of the driver 802$b$ are closed (with the other switches of the driver 802$b$ open) so as to connect capacitor CP1$b$ between the low-side rail and ground so that the capacitor CP1$b$ can acts as a reservoir capacitor for the charge pump 803.

The charge pump 803 then controls switches SW9 and SW11 together and in antiphase with switches SW10 and SW13 to repeatedly charge capacitor CP2 to VP, and then connect the capacitor CP2 between ground and the low-side rail, with its positive plate connected to ground, so as to drive the low-voltage rail to −VP. This charges the capacitor CP1$b$ to maintain the voltage at the low-side rail. The switches SW9, SW10, SW11 and, in this case, SW13, are cycled at a defined charge pump switching frequency which is independent of the duty cycle of the switching node 202$a$.

In this mode of operation, the charge pump 803 thus operates, together with the capacitor Cp1$b$ of the driver 802$b$, to provide a continuous supply voltage at the low-side rail, and the output node is directly coupled to this supply voltage.

The output node 202$a$ is thus switched between the voltages VP and 2VP with a controlled duty cycle, whilst the output node 202$b$ is held static, through the switching cycle at the voltage −VP and ground, to provide the desired output voltage based on the input signal. FIG. 9$d$ illustrates one example of switching waveforms Vouta and Voutb for the output nodes 202$a$ and 202$b$ and the resulting differential voltage Vdiff over one switching cycle period Tpwm in this fourth mode of operation for a positive differential output. For a negative differential output, the output node 202$a$ would instead be held static at −VP and the output node 202$b$ switched between +VP and +2VP.

Figure 10:
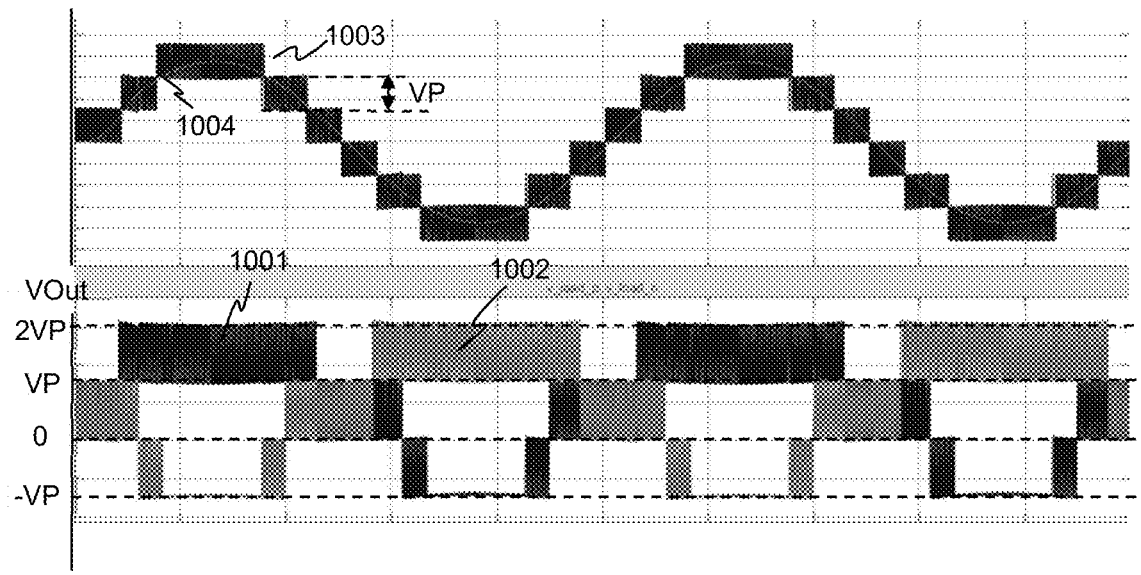
FIG. 10 illustrates example switching waveforms for the driver apparatus of FIG. 9 as the required output signal varies.

FIG. 10 illustrates examples waveforms for a switching driver apparatus 800 such as illustrated in FIG. 8 as the output signal varies. The waveforms 1001 and 1002 illustrate the voltages Vouta and Voutb at the output nodes 202$a$ and 202$b$ respectively. Waveform 1003 illustrates the unfiltered differential voltage across the load and waveform 1004 illustrates the resulting average differential output, i.e. the differential output signal as experienced by the load after filtering. It can be seen that the driver apparatus operates in the first mode for low signal magnitude and then switches to the second mode of operation as the required signal magnitude rises. As the magnitude rises higher, the driver switches to the third mode of operation. If the signal magnitude rises higher, such that the duty cycle for the output node switching between −VP and ground falls below a threshold, the driver apparatus switches to the fourth mode of operation so that one output node is held static and direct-coupled to a supply voltage of −VP to limit the impedance variation. When the signal magnitude then drops such that the duty cycle would be greater than the threshold, the driver apparatus transition back to the third mode of operation and then the second and first modes of operation as the signal magnitude reduces further.

FIG. 8 illustrates an embodiment where the charge pump 803 is configured to be operable, when required, to generate a negative boosted voltage at the low-side rails for the output nodes, in this case a voltage of −VP. In this case, the driver apparatus 800 operates with three supply voltages, which are the received system voltages ground and +VP and the voltage −VP which is generated by the charge pump 803. These three supply voltages can be seen as the three voltages V1, V2 and V3 discussed with reference to FIG. 2, although the supply voltage V3 is only generated by charge pump 803 when required (but, when it is generated it is generated so as to be a continuously maintained voltage throughout the switching cycle). In this example, the charge pumps of the drivers 802$a$ and 802$b$ provide the functionality of the flying capacitor driver and are operable to generate boosted voltages in an indirect-coupled mode. The charge pump of drivers 802$a$ and 802$b$ are operable to generate a boosted voltage +2VP, which is different to any of the supply voltages. The voltage +2VP generated by a charge pump of drivers 802$a$ and 802$b$ can thus be seen as the voltage V0 discussed above. The charge pump of drivers 802$a$ and 802$b$ are also operable to generate an additional boosted voltage −VP in an indirect-coupled mode, which in this case is the same as the supply voltage −VP which can be generated by the charge pump 803.

It will be understood, however, that the charge pump 803 could alternatively be arranged to provide a positive boosted supply voltage to the high side rail, i.e. to provide a supply voltage of +2VP. In this case, the fourth mode may correspond to one output node being held static with the supply voltage 2VP and the other output node being switched with a controlled duty cycle between −VP and ground. In some implementations there could be two charge pumps, coupled to the high-side and low-side rails respectively.

Note that the second mode of operation of the driver apparatus is described as a mode where one of the output nodes switches between −VP and ground, and the other node switches between ground and VP. It would be possible to implement an alternative second mode, that provides the same range of differential output voltage, by switching one output node between ground and VP, whilst the other output node is switched between +VP and +2VP.

It will also be understood that the voltages VP and ground are given as an example only.

Figure 11:
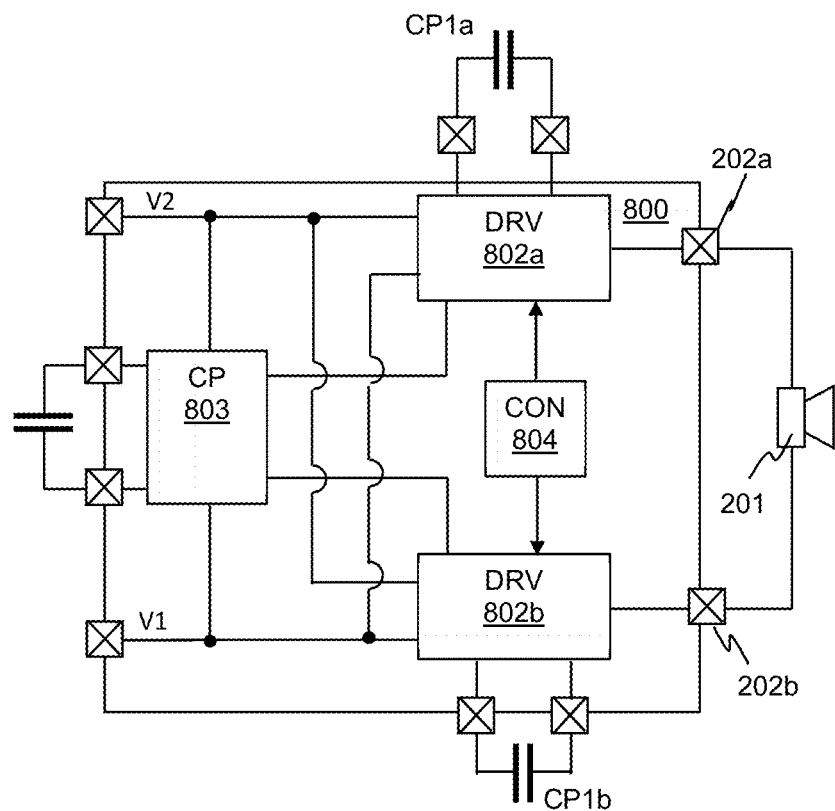
FIG. 11 illustrates generally the embodiment of a driver apparatus of FIG. 9.

In general, as illustrated in FIG. 11 the driver apparatus 800 according to this embodiment can be seen receiving system voltages V1 and V2, where V1 may be ground or some other defined reference and V1 may be an input supply. First and second drivers 801*a* and 801*b*, which are combined charge pumps and drivers, receive the system voltages V1 and V2 are arranged to drive the output nodes 202*a* and 202*b* respectively. An additional charge pump 803 is shared between the drivers to provide a supply voltage generated from the system voltages V1 and V2. A controller 804 controls the switching operation of the output stage 801, combined charge pump and drivers 802 and flying capacitor auxiliary driver 803 based on an input signal (not separately illustrated).

Embodiments of the disclosure thus relate to driver apparatus that operates with a multi-level switching voltages and which operates with a mixed direct-coupled and indirect-coupled energy transfer.

In some embodiments, there is provided a system and method for providing a multi-level output voltage, comprising: a plurality of voltage nodes to receive supply voltages, the supply voltages at separate voltage levels; at least one flying capacitor arranged to provide stored charge, the charge derived from the local voltage sources; and a switch network arranged to selectively couple one of the supply voltages or the flying capacitor to a voltage output node. The system may be configured to operate in at least two modes: a direct charge transfer mode, known as a DC-coupled mode, where at least one of the supply voltages is coupled to the voltage output node to provide an output voltage; and an indirect charge transfer mode, known as an AC-coupled mode, where the at least one flying capacitor is coupled to the voltage output node to provide an output voltage.

The supply voltages may comprise a system supply voltage or reference voltage (e.g. Vdd, −Vdd, Gnd), and at least one voltage source generated from a system supply voltage or reference voltage using a charge pump (e.g. 2Vdd). Preferably, the system comprises at least three voltage nodes to receive supply voltages.

The direct mode is understood as a configuration where a power supply is coupled to the output node to provide an output voltage. The direct mode may be a DC-coupled mode, where the output node is coupled to a semi-stable power supply. When in the direct charge transfer mode, the output impedance of the semi-stable power supply is signal independent. The indirect mode is understood as a configuration where stored charge on a capacitor is coupled to the output node to provide an output voltage. The capacitor is further coupled to a voltage source or power supply via switches, where adjustment of the switch connection can result in movement of the output voltage. The indirect mode may be an AC-coupled mode, where a capacitor is provided with switches to connect to the voltage sources and the output node, and where the transition of switched drives the output voltage. When in the indirect charge transfer mode, the output impedance of the indirect charge transfer network is signal dependent.

The combination of the two operational modes enables a higher peak power deliverable to be supported without too much duty-cycle dependent impedance constraints.

Some embodiments relate to a system and method for providing a multi-level output voltage, comprising first, second and third voltage supplies at different voltage levels; a fourth voltage supply, wherein the fourth voltage supply is provided by a flying capacitor transitioning between two of the first, second and third voltage supplies; and switch network configured to selectively couple the first, second, third and fourth voltage supplies to an output node, to provide a multi-level output voltage. The third voltage supply may be derived from the first and second voltage supplies using a charge pump. The system may be operable in a direct mode (or DC-coupled mode) and in an indirect mode (or AC-coupled mode), as described above.

In some embodiments there is also provided a multi-level converter or driver apparatus (such as an amplifier) having a supply voltage (VP) comprising: an output bridge arranged to receive an input signal (e.g. an audio input signal) and to output an output voltage for driving a load; at least one charge pump arranged to output a multiple of a supply voltage (e.g. 2VP); a first negative flying capacitor-based driver; and a switch network. The switch network is controlled to selectively couple the output bridge with the supply voltage, ground, the charge pump, and the first negative flying capacitor-based driver, where the switching of the switch network is controlled based on the input signal.

Preferably, the switch network is configured to switch the negative flying capacitor-based driver such that one end of the flying capacitor is coupled to the output voltage node, where the voltage at the other end of the flying capacitor can be switched to adjust the output voltage level. The converter may be operable in a direct mode and an indirect mode, as described above.

In some examples, the converter may further comprise a second negative flying capacitor-based driver, the second flying capacitor-based driver adapted to store twice the charge of the first negative flying capacitor-based driver; and wherein the switch network is controlled to selectively couple the output bridge with the second negative flying capacitor-based driver.

Some embodiments relate to a multi-level converter or driver apparatus (such as an amplifier, e.g. a loudspeaker amplifier) comprising: a first combined charge pump driver, e.g. a speaker driver, to receive an input signal and provide an output signal to a first load terminal; a second combined charge pump driver, e.g. a speaker driver, to receive an input signal and provide an output signal to a second load terminal; at least one auxiliary charge pump; and a switch network, wherein the at least one auxiliary charge pump is configured to be selectively coupled with the first and/or second combined charge pump drivers, to provide additional charge levels to the first and/or second combined charge pump drivers.

The connection of the auxiliary charge pump to the drivers may be based on an input signal received by the multi-level converter, e.g. an audio input signal. It will be understood that the converter may comprise a low-side auxiliary charge pump, a high-side auxiliary charge pump, or both.

Some embodiments relate to a multi-level converter (such as an amplifier) arranged to receive a supply voltage and provide an output voltage at an output terminal, the converter comprising: at least one driver, e.g. a speaker driver, having an integrated direct charge pump; at least one auxiliary supply, preferably provided as an auxiliary helper charge pump; and a switch network coupling the driver and negative supply. The converter may be operable in at least two modes: a direct mode, where the driver with integrated charge pump generates an output voltage based on the supply voltage, and a hybrid mode, where the auxiliary supply is coupled with the driver to provide an increased output voltage level.

Preferably, the integrated direct charge pump comprises a switch to drive an output voltage based on the supply voltage, the integrated direct charge pump further comprising a capacitor operable to drive an output voltage based on a multiple of the supply voltage.

As used herein, the term DC-coupled may be understood as switching between two voltage levels, preferably using resistive switches. This can be extended to three or more voltages, with more switches. By way of example, DC voltages may be derived from a battery, an inductive switched mode power supply, or a switched cap power supply. Such power sources are assumed to be able to supply current for an extended period of time, for example greater than the period of the class D output signals at the lowest needed frequency.

As used herein, the term AC-coupled may be understood as an output driven to a voltage level by switching terminal T1 of a capacitor between two voltages while terminal T2 of the capacitor is coupled to the output. This can result in the load terminal driven outside of the range of the DC coupled power supplies. The capacitor and the load have a time constant, inherently limiting the duration of the pulse. If the load has an impedance of R, the capacitor a value of C, then RC would normally be chosen to be 1-100× the class D switching frequency.

For a system having a nominal 5V supply, 0V and 5V terminals, AC coupling alone could be used to achieve {0,5,10} V output or {-5,0,5} V. Alternative DC coupling alone with voltages, {0,5,10} V from three different rails could be used. However, an advantage of the above-described system comes with combining the AC- and DC-coupling systems for at least four levels of output. Two of the states are available directly from the power supply, i.e. DC coupled. Another DC state is made possible by a switched capacitor DC-DC converter. A fourth state is AC coupled. Using S to notate supply, and D and A for DC/AC coupled respectively, an example configuration of output voltages can be as follows:

{0S, 5S, 10D, −5A}
{0S, 5S, 10D, 15A}
{0S, 5S, −5D, 10A}
{0S, 5S, −5D, −10A}
{0S, 5S, 10D, 20A}
{0S, 5S, 10D, −10A}

The last two output voltage configurations are possible by using the DC supply for the source of the T1 capacitor terminal drive. If multiple supplies are available, the AC drive boost does not have to be the same supply as the main supply. For example, if 0V 2V 5V are the available rails, output choices of {0,5,7} would be possible.

The driver apparatus of embodiments of the disclosure may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals to implement the different modes, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver apparatus for driving a transducer based on an input signal comprising:
 a first driver output node for outputting a first drive signal;
 a switch network;
 a flying capacitor driver having an output voltage node for connection, in use, to a first terminal of a flying capacitor, the flying capacitor driver being selectively operable in a first state with a second terminal of the flying capacitor connected to a first input voltage and the first terminal of the flying capacitor connected to a second input voltage to charge the flying capacitor and drive the output voltage node to the second input voltage, and a second state with the second terminal of the flying capacitor connected to a third input voltage, different to the first input voltage, and the first terminal of the flying capacitor disconnected from the second input voltage to drive the output voltage node to a boosted voltage; and
 a controller;
 wherein the switch network is operable to selectively connect the first driver output node to the output voltage node of the flying capacitor driver or to any of a first set of at least three different switching voltages, wherein the switching voltages of the first set are, in use, maintained at a respective voltage node throughout a switching cycle of the driver apparatus; and
 wherein the controller is configured to control the switch network and the flying capacitor driver to generate the first drive signal at the first driver output node based on the input signal, wherein in at least one mode of operation the first driver output node is switched between two of the first set of switching voltages with a controlled duty cycle based on the input signal and in at least one mode of operation the first driver output node is connected to the output voltage node of the flying capacitor driver and the flying capacitor is switched between the first and second states with a controlled duty cycle based on the input signal.

2. The driver apparatus of claim 1 wherein the first set of switching voltages comprises first and second supply voltages received by the driver apparatus.

3. The driver apparatus of claim 2 wherein the driver apparatus comprises a DC-DC converter configured to generate at least a third supply voltage from at least one of the first and second supply voltages.

4. The driver apparatus of claim 3 wherein the DC-DC converter comprises a charge-pump or inductive boost converter.

5. The driver apparatus of claim 3 wherein the first supply voltage is less positive or more negative than the second supply voltage and the DC-DC converter is configured to generate the third supply voltage as V3=V2+(V2−V1), where V1 is the first supply voltage and V2 is the second supply voltage.

6. The driver apparatus of claim 1 wherein at least one of said first, second and third input voltages is the same as a voltage of the first set of switching voltages.

7. The driver apparatus of claim 6 wherein the first set of switching voltages comprises first and second supply voltages received by the driver apparatus and said first input voltage is the same as the second supply voltage and each of the second and third input voltages is the same as the first supply voltage.

8. The driver apparatus of claim 1 further comprising a second driver output node, wherein the switch network is further configured to selectively connect the second driver output node to the output voltage node of the flying capacitor driver or to any of the first set of at least three different switching voltages,
 wherein the controller is further configured to control the switch network and flying capacitor driver to generate a first drive signal at the second driver output node based on the input signal so as to drive a transducer connected between the first and second driver output nodes with a differential drive signal.

9. The driver apparatus of claim 8 wherein the switch network comprises:
 switches for selectively connecting the first and second driver output nodes respectively to a first voltage rail and switches for selectively connecting the first and second driver output nodes respectively to a second voltage rail; and
 switches for selectively connecting either of at least two of the first set of switching voltages to the first voltage rail;
 and wherein the output voltage node of the flying capacitor driver is, in use, coupled to one of the first and second driver output nodes via the second voltage rail.

10. The driver apparatus of claim 9 wherein the switch network further comprises switches for selectively connecting the first and second driver output nodes respectively to one of the first set of switching voltages which is different to the voltages that can be selectively connected to the first voltage rail.

11. The driver apparatus of claim 8 wherein the controller is operable:

in a first mode in which each of the first and second driver output nodes is switched between first and second supply voltages of the first set of switching voltages;

in a second mode in which one of the first and second driver output nodes is switched between said first and second supply voltages and the other one of the first and second driver output nodes is connected to the output voltage node of the flying capacitor driver which operates to switch the output voltage node between the first supply voltage and the boosted voltage; and in a third mode in which one of the first and second driver output nodes is switched between said second supply voltage and a third supply voltage of the first set of switching voltages.

12. The driver apparatus of claim 11 where the driver apparatus comprises a DC-DC converter configured to generate said third supply voltage from said first and second supply voltages.

13. The driver apparatus of claim 1 further comprising a second flying capacitor driver, wherein the controller is operable to control the flying capacitor driver and the second flying capacitor driver together to modulate the output voltage node between said boosted voltage generated by the flying capacitor driver and an additional boosted voltage generated by the second flying capacitor driver.

14. The driver apparatus of claim 1 wherein the first set of switching voltages, and the boosted voltage generated by the flying capacitor driver, together form a set of equally spaced voltage levels.

15. The driver apparatus of claim 1 wherein the first set of switching voltages comprises a received ground voltage, a received positive supply voltage and a boosted voltage equal to twice the received positive supply voltage.

16. The driver apparatus of claim 1 wherein the driver apparatus is an audio driver apparatus for driving an audio output transducer based on an audio input signal.

17. An integrated circuit comprising the driver apparatus of claim 1.

18. An electronic device comprising the driver apparatus of claim 1.

19. A transducer driver configured to receive an input signal and first and second supply voltages and to generate an output signal for driving a transducer, the transducer driver comprising:

a combined charge pump and driver operable, in use, with at least one primary capacitor to selectively provide at least a first generated voltage based on the first and second supply voltages;

a flying-capacitor driver operable, in use, with at least one secondary capacitor to provide at least a second generated voltage based on the first and second supply voltages; and an output bridge configured to selectively receive the first and second supply voltages, the first generated voltage and the second generated voltage to generate the output signal based on the input signal;

wherein the combined charge pump and driver is operable, in use, with first and second primary capacitors.

20. A transducer driver configured to receive an input signal and first and second supply voltages and to generate an output signal for driving a transducer, the transducer driver comprising:

a combined charge pump and driver operable, in use, with at least one primary capacitor to selectively provide at least a first generated voltage based on the first and second supply voltages;

a flying-capacitor driver operable, in use, with at least one secondary capacitor to provide at least a second generated voltage based on the first and second supply voltages; and an output bridge configured to selectively receive the first and second supply voltages, the first generated voltage and the second generated voltage to generate the output signal based on the input signal;

wherein the flying-capacitor driver is operable, in use, with first and second secondary capacitors.

* * * * *